(12) United States Patent
Bergstresser et al.

(10) Patent No.: US 6,268,070 B1
(45) Date of Patent: *Jul. 31, 2001

(54) LAMINATE FOR MULTI-LAYER PRINTED CIRCUIT

(75) Inventors: Tad Bergstresser, Shaker Heights; Charles A. Poutasse, Beachwood, both of OH (US)

(73) Assignee: Gould Electronics Inc., Eastlake, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/266,951

(22) Filed: Mar. 12, 1999

(51) Int. Cl.[7] ........................................ B32B 15/08
(52) U.S. Cl. .................... 428/622; 428/624; 428/675; 428/676; 428/209; 428/343; 428/458
(58) Field of Search .......................... 428/209, 901, 428/622, 624, 674, 675, 676, 41.8, 343, 458

(56) References Cited

U.S. PATENT DOCUMENTS

| | | | |
|---|---|---|---|
| 4,193,849 | * | 3/1980 | Sato ................................ 204/38 B |
| 4,383,003 | * | 5/1983 | Lifshin et al. ....................... 428/611 |
| 5,130,192 | * | 7/1992 | Takabayashi et al. ............... 428/332 |
| 5,589,280 | | 12/1996 | Gibbons et al. ...................... 428/626 |
| 5,591,519 | * | 1/1997 | Caron et al. ......................... 428/344 |

OTHER PUBLICATIONS

U.S. application No. 09/266,952, filed Mar. 12, 1999, entitled: Flexible Laminate For Flexible Circuit; Centanni et al.

* cited by examiner

*Primary Examiner*—Deborah Jones
*Assistant Examiner*—Stephen Sten
(74) *Attorney, Agent, or Firm*—Mark Kusner; Michael A. Centanni

(57) ABSTRACT

A laminate for use as a surface laminate in a multi-layer printed circuit board. The laminate is comprised of a film substrate formed of a first polymeric material. At least one layer of a flash metal is applied to a first side of the film substrate. At least one layer of copper is disposed on the layer of flash metal. An adhesive layer formed of a second polymeric material has a first surface that is attached to a second side of the film substrate.

14 Claims, 1 Drawing Sheet

LAMINATE FOR MULTI-LAYER PRINTED CIRCUIT

FIELD OF THE INVENTION

The present invention relates generally to printed circuits, and more specifically, to components employed in the manufacturing of printed circuit boards.

BACKGROUND OF THE INVENTION

In recent years, printed circuit components have become widely used in a variety of electronic devices. Of particular interest are multi-layer printed circuit board laminates which have been developed to meet the demand for miniaturization of electronic components and the need for printed circuit boards having a high density of electrical interconnections and circuitry. In the manufacture of printed circuit boards, raw materials, including conductive foils, which are usually copper foils, are secured to opposite sides of a core which is conventionally a reinforced or non-reinforced dielectric. (Throughout this specification, the use of the term "core" is meant to include any one of a variety of core materials, all of which may be reinforced or non-reinforced and may include an epoxy, polyester, polyimide, a polytetrafloroethylene, and in some applications, a core material which includes previously formed printed circuits.)

The process includes one or more etching steps in which the undesired or unwanted copper is removed by etching away portions of the conductive foil from the laminate surface to leave a distinct pattern of conductive lines and formed elements on the surface of the etched laminate. The etched laminate and other laminate materials may then be packaged together to form a multi-layer circuit board package. Additional processing, such as hole drilling and component attaching, will eventually complete the printed circuit board product.

The trend in recent years has been to reduce the size of electronic components and provide printed circuit boards having multi-chip modules, etc. This results in a need to increase the number of components, such as surface-mount components provided on the printed circuit board. This in turn results in a so-called "densely populated" or simply "dense" printed circuit board. A key to providing a densely populated printed circuit board is to produce close and fine circuit patterns on the outer surfaces (i.e., the exposed surfaces) of the resulting multi-layer printed circuit board. The width and spacing of conductive paths on a printed circuit board are generally dictated by the thickness of the copper foil used thereon. For example, if the copper foil has a thickness of 35 $\mu$m (which is a conventional 1-ounce foil used in the manufacture of many printed circuits), exposing the printed circuit board to an etching process for a period of time to remove such a foil thickness will also reduce the width of the side areas of the printed circuit path in approximately the same amount. In other words, because of the original thickness of the copper foil, a printed circuit board must be designed to take into account that an etching process will also eat away the sides of a circuit path (i.e., undercut a masking material). In other words, the thickness of the spacings between adjacent circuit lines is basically limited by the thickness of the copper foil used on the outer surface of the multi-layer printed circuit board.

In summary, to produce "densely populated" printed circuit boards, it is necessary to reduce the thickness of the copper, at least on the outermost surface of the multi-layer printed circuit package.

The thickness of the copper foil sheet is generally limited by the ability of a foil manufacturer to handle and transport such sheets. In this respect, as the thickness of the foil decreases below 35 $\mu$m, the ability to physically handle such foil becomes more difficult.

The present invention overcomes this and other problems and provides an outer surface laminate for forming multi-layer printed circuit boards having an outer copper layer that facilitates finer circuit lines and closer line spacings on multi-layer printed circuit boards.

SUMMARY OF THE INVENTION

In accordance with the present invention, there is provided a laminate for use as a surface laminate in a multi-layer printed circuit board. The laminate is comprised of a film substrate formed of a first polymeric material. At least one layer of a flash metal is applied to a first side of the film substrate. At least one layer of copper is disposed on the layer of flash metal. An adhesive layer formed of a second polymeric material has a first surface that is attached to a second side of the film substrate.

In accordance with another aspect of the present invention, there is provided a multi-layer printed circuit comprised of an inner core and a surface laminate. The inner core is formed of one or more printed circuit laminates, wherein the printed circuit laminates are comprised of a core substrate having a first surface with a strip conductor disposed thereon. The surface laminate is comprised of a film substrate formed of a first polymeric material having at least one layer of flash metal applied to a first side of the film substrate. At least one layer of copper is disposed on the layer of flash metal. An adhesive layer formed of a second polymeric material has a first surface attached to a second side of the film substrate. The adhesive layer has a second surface that is attached to the strip conductor of the inner core.

In accordance with another aspect of the present invention, there is provided a method of forming a multi-layer printed circuit that comprises the steps of:

a) forming an inner core from one or more printed circuit laminates, each of the printed circuit laminates having a core substrate and a first surface with a strip conductor disposed thereon;

b) forming at least one surface laminate comprised of a film substrate formed of a first polymeric material, at least one layer of a flash metal applied to a first side of the film substrate, at least one layer of copper on the layer of flash metal and an adhesive layer formed of a second polymeric material having a first surface and a second surface, the first surface of the adhesive layer being attached to a second side of the film substrate and the second surface being attached to the strip conductor of the inner core; and c) compressing the inner core and the surface laminate together under conditions of heat and pressure to create a first multi-layer printed circuit.

It is an object of the present invention to provide a flexible laminate for use in forming multi-layer flexible circuits.

Another object of the present invention is to provide an outer surface laminate for a multi-layer printed circuit, wherein the outer surface laminate has an exceptionally thin layer of copper that facilitates fine circuit lines and a "densely populated" circuit surface.

Another object of the present invention is to provide an outer surface laminate as described above that has an exposed copper surface having improved photoresist adhesion properties that further facilitates the creation of fine circuit lines and a "densely populated" circuit surface by an etching process.

Another object of the present invention is to provide an outer surface laminate as described above, wherein one side of the outer surface laminate includes an adhesive layer for attachment to core laminates.

Another object of the present invention is to provide an outer surface laminate as described above, wherein the outer surface laminate is comprised of a polymeric film having a thin layer of copper adhered to one side of the polymeric film and a layer of an adhesive as applied to a second side of the polymeric film.

A still further object of the present invention is to provide an outer surface laminate as described above, wherein the adhesive is a dimensionally stable film of an uncured resin material.

These and other objects and advantages will become apparent from the following description of preferred embodiments of the invention, taken together with the accompanying drawings.

BRIEF DESCRIPTION OF THE DRAWINGS

The invention may take physical form in certain parts and arrangement of parts, embodiments of which are described in detail in the specification and illustrated in the accompanying drawings, wherein.

DETAILED DESCRIPTION OF PREFERRED EMBODIMENT

Figure 1:
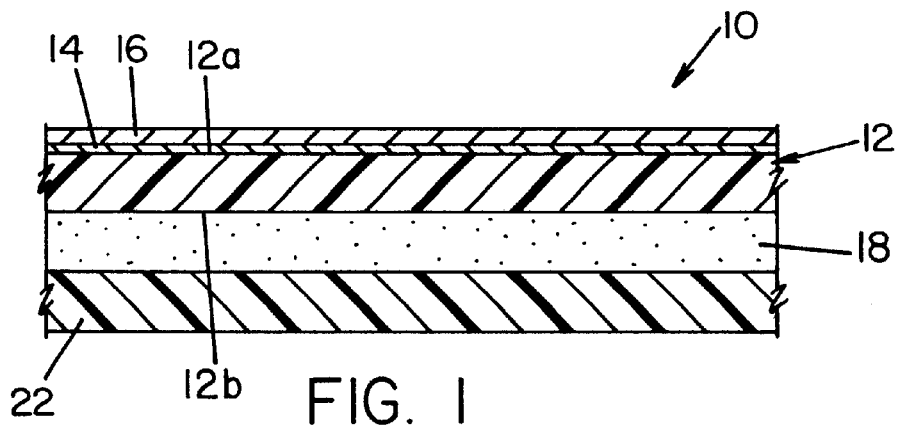
FIG. 1 is a cross-sectional view of a laminate illustrating a preferred embodiment of the present invention.

Referring now to the drawings wherein the showings are for the purpose of illustrating preferred embodiments of the invention only, and not for the purpose of limiting same, FIG. 1 shows a cross-sectional view of a surface laminate 10 illustrating a preferred embodiment of the present invention. Broadly stated, surface laminate 10 is comprised of a polymeric film 12 having a first surface 12a and a second surface 12b. A thin metallic layer 14 of a flash metal (conventionally referred to as a "tiecoat") is applied to surface 12a of polymeric film 12. At least one metallic layer 16, preferably formed of copper, is applied to flash layer 14. An adhesive layer 18 is disposed on surface 12b of polymeric film 12. In the embodiment shown, a releasable protective film layer 22 is provided on the exposed surface of adhesive layer 18.

Polymeric film 12 is preferably formed of polyimide and has a thickness of between 12.5 $\mu$m and 125 $\mu$m. Specific examples of materials that may form polymeric film 12 include Kapton-E or Kapton-HN (manufactured by I.E. DuPont), Upilex-S or Upilex-SGA (manufactured by Ube) and Apical NP (manufactured by Kaneka). Flash layer 14 may be formed from metals selected from the group consisting of chromium, chromium-based alloys, nickel-based alloys, titanium, aluminum, vanadium, silicon, iron and alloys thereof. Flash layer 14 preferably has a thickness of between 0 Å (none) and 500 Å, and more preferably, between about 50 Å to 200 Å.

As indicated above, metallic layer 16 is preferably formed of copper, and has a preferable thickness of between 0.1 $\mu$m (1000 Å) and 70 $\mu$m. The copper forming metallic layer or layers 16 may be applied by vacuum-metallization, electrodeposition, electroless deposition or combinations thereof on flash layer or layers 14. In accordance with a preferred embodiment of the present invention, metallic layer 16 is electrodeposited onto flash layer 14.

Referring now to adhesive layer 18, the overall thickness of adhesive layer 18 is preferably between 12.5 $\mu$m and 125 $\mu$m. Adhesive 18 is preferably a dimensionally stable adhesive and may be a B-staged or a partially cured resin material or a pressure-sensitive adhesive. A product manufactured and sold by Minnesota Mining and Manufacturing (3M) under the name "High Performance Epoxy Adhesive Bonding Film" finds advantageous use as the adhesive film in the production of the flexible laminate according to the present invention. This product is comprised of an epoxy resin and is available in thicknesses of about 1 to 3 mils. The materials are provided by the manufacturer with removable protective polymer films on both surfaces thereof. The material has the following physical properties as disclosed by the manufacturer.

| Property | Units | | IPC Test |
|---|---|---|---|
| Glass Transition* | ° C. | 180 | |
| CTE    20° C.–110° C. | ppm/° C. | 60 | |
|             110° C.–180° C. | | 87 | |
|             180° C.–250° C. | | 213 | |
| Peel Strength | Lbs./inch | 8 | 2.4.9 |
| Volatile Content | % | 1 | 2.3.37 |
| Moisture Absorption | % | 1.7 | 2.6.2B |
| Chemical Resistance | % | >90 | 2.3.2 |
| Dielectric Constant* | | 3.4 | 2.5.5.3 |
| Dissipation Factor* | | .022 | 2.5.5.3 |
| Dielectric Strength | Volts/mil | 2200 | D-149 |
| Insulation Resistance | Megohms | 1.00E+06 | 2.6.3.2 |
| Volume Resistivity | Megohms-cm | 5.00E+07 | 2.5.17 |
| Surface Resistivity | Megohms | 7.00E+05 | 2.5.17 |
| Solder Float | | Pass | 2.4.13 |
| Low Temperature Flexibility | | Pass | 2.6.18 |
| Flexural Endurance | Cycles | 1787 | 3.7.4 |
| Fracture Toughness | Mpa*m$^{1/2}$ | 0.65 | |
| Modulus | GPa | 3.5 | |

Examples of other adhesives that may find advantageous application in the present invention as adhesive layer 18 include acrylics, epoxies, nitrite rubbers, phenolics, polyamides, polyarylene ethers, polybenzimidazoles, polyesters, polyimides, polyphenylquinoxalines, polyvinyl acetals, polyurethanes, silicones, vinyl-phenolics, urea-formaldehyde and combinations thereof. The adhesive preferably is flame retardant naturally or has a flame retardant material added to it.

Protective film 22 preferably has a thickness of between 12.5 $\mu$m and 125 $\mu$m. Films that would find advantageous application as a protective film 22 include fluoroplastics, polyester, polyolefin, polyethylene, polypropylene, polyvinyl alcohol, vinyl resin (PVC and PVDC), and mixtures thereof.

Figure 2:
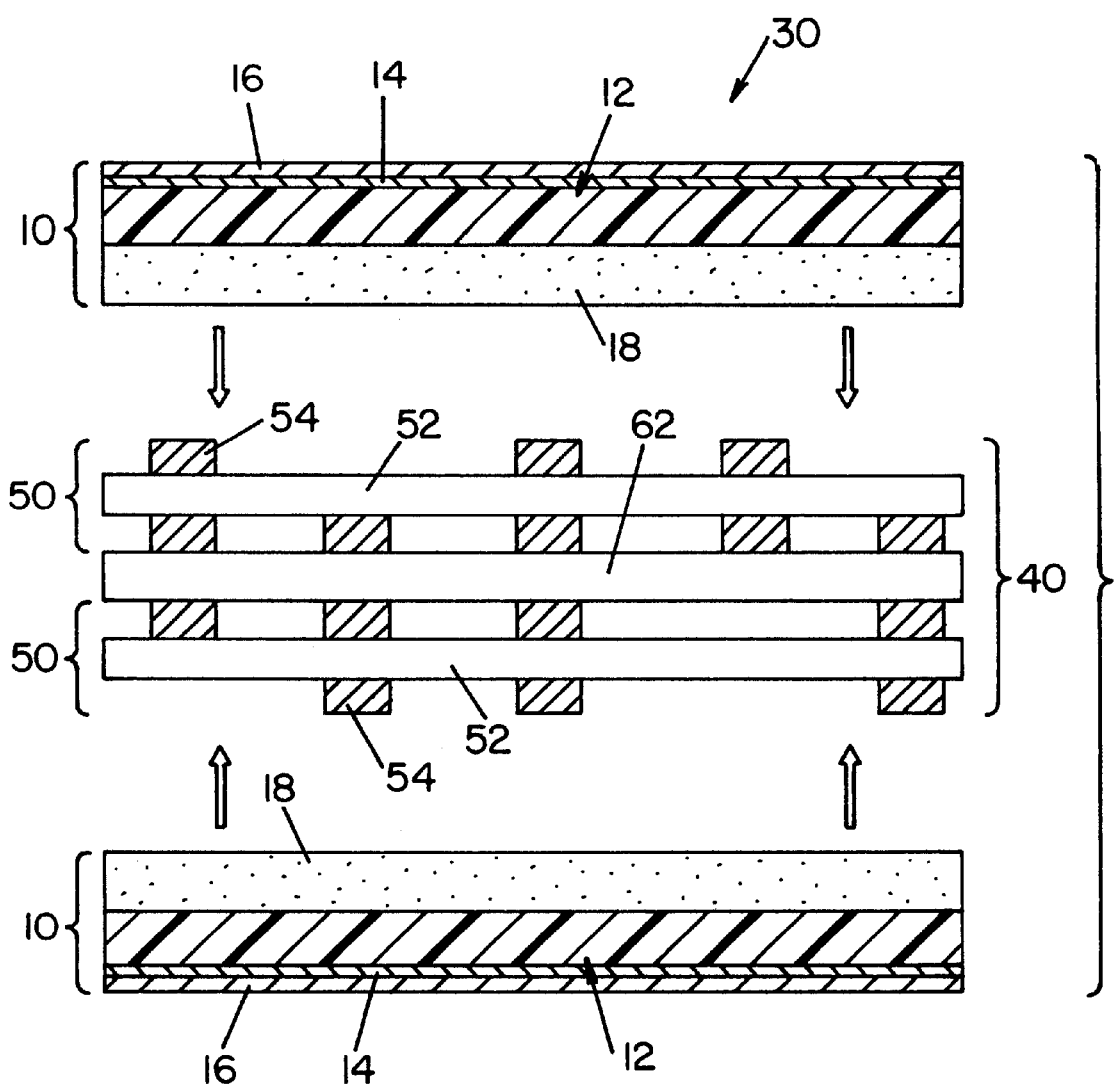
FIG. 2 is an exploded, cross-sectional view of a multi-layer printed circuit using the laminate shown in FIG. 1.

According to one aspect of the present invention, laminate 10 is preferably formed as a individual component for later use in forming a multi-layer printed circuit. FIG. 2 shows a multi-layer printed circuit 30 having surface laminates 10 as the outer surface sections thereof. Multi-layer printed circuit 30 is generally comprised of an inner laminate section 40 that is comprised of two previously formed printed circuit laminates 50. Circuit laminates 50 are separated by an intermediate dielectric layer 62. Each printed circuit laminate 50 is comprised of an inner core 52 having circuit leads or connectors 54 formed on the outer surfaces thereof. As indicated above, cores 52 may be reinforced or non-reinforced and may include an epoxy, polyester, cyanate ester, bismaleimide triazine, polynorborene, teflon, polyimide or a resinous material, and mixtures thereof, as is conventionally known. Printed circuit laminates 50 are secured to dielectric layer 62, as is conventionally known.

In accordance with the present invention, surface laminates 10 are applied to inner section 40. Specifically, releasable protective films 22 are removed from surface laminates 10 to expose the surface of adhesive layer 18. Adhesive layer 18 is brought into contact with circuit leads 54 of the respective printed circuit laminates 50. Depending upon the material used in adhesive layer 18, a permanent bond between adhesive layer 18 and circuit leads 54 may be accomplished by heat and pressure.

The resulting multi-layer printed circuit 30 thus has outer surface laminates 10 with an exposed metallic layer 16 available for a subsequent etching process to define a specific surface path or pattern from metallic layer 16. Importantly, as indicated above, because metallic layer or layers 16 may be deposited onto a polymeric film 12, the thickness of metallic layer 16 may be extremely thin as compared to conventional metallic foil. As indicated above, metallic layer 16 may have a thickness as low as 0.1 $\mu$m (1000 Å). Such thin layers of copper on the outer surfaces of multi-layer printed circuit 30 facilitates forming extremely fine and closely spaced circuit lines and patterns by an etching process. In addition, the exposed copper surface of metallic layer 16 can be rougher than the typically flat surface of standard copper foils, thereby providing increased photoresist adhesion, which also facilitates forming extremely fine and closely spaced circuit lines and patterns by an etching process. Moreover, the absence of glass fibers (typically found in glass-reinforcing prepregs) makes for easier laser drilling of microvias to connect metallic layer 16 with circuit leads 54 on printed circuit laminates 50. Still further, polymeric materials, such as polyimide, have better dielectric properties as compared to conventional glass-reinforced prepregs, thereby providing improved electrical performance, such as for example, reduced attenuation of high speed signals. Furthermore, the high heat stability of materials such as polyimides can provide better resistance to thermal excursions that arise during the chip attachment process. Thus, surface laminate 10, as used as an outer surface layer in a multi-layer printed circuit assembly, facilitates the production of more densely packed multi-layer printed circuit boards.

The present invention shall now be described by way of examples.

EXAMPLE 1

A surface laminate 10 according to the present invention is prepared by applying a strip of the aforementioned 3M High Performance Epoxy Adhesive Film 9002 to a preformed adhesiveless, flexible laminate comprised of a 25 $\mu$m Kapton-E polymeric film 12 having a 70 Å flash layer 14 formed of monel and a 5 $\mu$m metallic layer 16 of copper. Heat and/or pressure is preferably used to adhere adhesive layer 18 to polyimide film 12. The adhesiveless, flexible laminate material comprised of layers 12, 14 and 16 is preferably joined to adhesive layer 18 by means of hot roll lamination. The temperature of the rolls is about 140° F. The line speed is about 9 inches per minute. A protective cover, typically found on 3M's Epoxy Adhesive Film, is maintained as protective film layer 22. The resulting composite has 5 $\mu$m of copper, 70 Å of a monel tiecoat, 25 $\mu$m of Kapton-E polyimide film and about a 50 $\mu$m 3M Epoxy Adhesive Film in a partially cured state with a 50 $\mu$m cover sheet thereon.

A contemplated method of using surface laminate 10 would be as follows:

1) Take a multi-layer circuit board construction comprised of alternating inner layers and bond ply layers (either previously laminated together under heat and pressure or not) and then lay up with surface laminate 10 on either one or both sides after removing protective releasable film 22. Adhesive layer 18 is now contacting the multi-layer circuit board stack.

2) Laminate surface laminates 10 to the multi-layer circuit board through conventional laminating techniques.

3) Process the exterior surface of surface laminate 10 to form strip conductors (i.e., printed circuits) by techniques known to those skilled in the art to complete a multi-layer printed circuit board.

EXAMPLE 2

A surface laminate 10 according to the present invention is prepared by applying a strip of the aforementioned 3M High Performance Epoxy Adhesive Film 9901 or 9902 onto a previously formed adhesiveless flexible laminate comprised of a 50 $\mu$m Kapton-E polymeric film 12 having a 70 Å flash layer 14 formed of monel and an 18 $\mu$m metallic layer 16 of copper. Heat and/or pressure is preferably used to adhere adhesive layer 18 to polyimide film 12. The adhesiveless, flexible laminate material comprised of layers 12, 14 and 16 is preferably joined to adhesive layer 18 by means of hot roll lamination. The temperature of the rolls is about 140° F. The line speed is about 9 inches per minute. A protective cover, typically found on 3M's Epoxy Adhesive Film, is maintained as protective film layer 22. The resulting composite has 18 $\mu$m of copper, 70 Å of a monel tiecoat, 50 $\mu$m of Kapton-E polyimide film and about a 50 $\mu$m 3M Epoxy Adhesive Film in a partially cured state with a 50 $\mu$m cover sheet thereon.

A contemplated method of using surface laminate 10 would be as follows:

1) Using techniques known to those skilled in the art, process the copper side of one or more of the aforementioned composite structures to form a desired circuit pattern or circuit leads thereon. Releasable protective film 22 preferably covers the adhesive layer 18 during such process so as to protect the adhesive from processing chemicals.

2) Creating desired openings through surface laminate 10 at desired locations to allow interconnection of metal layers may be done at this time. The formation of openings may be by laser ablation or other techniques known in the art.

3) Creating metal-to-metal interconnections may be done at this time using techniques known to those skilled in the art.

4) Remove protective releasable film 22 to expose adhesive layer 18 and align surface laminate 10 with an inner section 40, as described above.

5) Laminate surface laminates 10 to inner section 40 through conventional laminating techniques.

6) The openings and metal-to-metal interconnections may be made at this time using techniques known to those skilled in the art.

7) Apply conventional techniques to exterior surfaces of surface laminate 10 to complete multi-layer printed circuit boards.

The foregoing description is a specific embodiment of the present invention. It should be appreciated that this embodiment is described for the purpose of illustration only, and that numerous alterations and modifications may be practiced by those skilled in the art without departing from the spirit and scope of the invention. It is intended that all such modifications and alterations be included insofar as they come within the scope of the invention as claimed or the equivalents thereof.

Having described the invention, the following is claimed:

1. A laminate for use as a surface laminate in a multi-layer printed circuit board, said laminate comprising:
   a film substrate formed of a first polymeric material;
   at least one layer of a flash metal applied to a first side of said film substrate;
   at least one layer of copper on said layer of flash metal;
   an adhesive film layer formed of a material selected from the group consisting of acrylics, epoxies, nitrile rubbers, phenolics, polyamides, polyarylene ethers, polybenzimidazoles, polyesters, polyimides, polyphenylquinoxalines, polyvinyl acetals, polyurethanes, silicones, vinyl-phenolics, urea-formaldehyde and combinations thereof, said adhesive layer having a uniform thickness between 12.5 μm and 125 μm and a first surface attached to a second side of said film substrate; and
   a protective release layer on said second surface of said adhesive film layer.

2. A laminate as defined in claim 1, wherein said at least one flash layer is comprised of a metal selected from the group consisting of copper, nickel, chromium, titanium, aluminum, iron, vanadium, silicon and alloys thereof.

3. A laminate as defined in claim 2, wherein said at least one flash layer has a thickness of about 50 Å to about 500 Å.

4. A laminate as defined in claim 3, wherein said at least one layer of copper has a thickness of about 1000 Å to about 35 μm.

5. A laminate as defined in claim 4, wherein said first polymeric material is a polyimide.

6. A laminate as defined in claim 5, wherein said adhesive film layer is dimensionally stable.

7. A laminate as defined in claim 6, wherein said adhesive film layer is cured to a B-stage.

8. A laminate as defined in claim 6, wherein said first surface of said adhesive film layer is cured to a C-stage and said second surface of said adhesive film layer is cured to a B-stage.

9. A laminate as defined in claim 5, wherein said adhesive film layer is a pressure sensitive adhesive.

10. A laminate as defined in claim 9, wherein said pressure sensitive adhesive is selected from a group consisting of polyacrylates, rubbers, silicones and styrene-butadiene-styrene elastomers.

11. A laminate for use as a surface laminate in a multi-layer printed circuit board said laminate comprising:
    a film substrate formed of a first polymeric material;
    at least one layer of a flash metal applied to a first side of said film substrate;
    at least one layer of copper on said layer of flash metal;
    an adhesive layer formed of a second polymeric material, said adhesive layer having a first surface and a second surface, said first surface of said adhesive layer being attached to a second side of said film substrate; and
    a protective release layer on said second surface of said adhesive film layer, said protective release layer being formed of a material selected from the group consisting of fluoroplastics, polyester, polyolefin, polyvinyl alcohol, vinyl resin (PVC and PVDC), ethylene-vinyl alcohol, and mixtures thereof.

12. A multi-layer printed circuit, comprising:
    a) an inner core formed from one or more printed circuit laminates, said printed circuit laminates comprised of a core substrate having a first surface with a strip conductor disposed thereon, and
    b) at least one surface laminate, comprised of:
       a film substrate formed of a first polymeric material;
       at least one layer of a flash metal applied to a first side of said film substrate;
       at least one layer of copper on said layer of flash metal; and
       an adhesive film formed of a second polymeric material selected from the group consisting of acrylics, epoxies, nitrile rubbers, phenolics, polyamides, polyarylene ethers, polybenzimidazoles, polyesters, polyimides, polyphenylquinoxalines, polyvinyl acetals, polyurethanes, silicones, vinyl-phenolics, urea-formaldehyde and combinations thereof, said adhesive layer having a uniform thickness between 12.5 μm and 125 μm and having a first surface and a second surface, said first surface of said adhesive layer being attached to a second side of said film substrate; and said second surface attached to said strip conductor.

13. A multi-layer printed circuit as defined in claim 12, wherein said inner core is comprised of a reinforced polymer.

14. A multi-layer printed circuit as defined in claim 12, wherein said inner core is comprised of a non-reinforced polymer.

* * * * *